United States Patent
Weimer et al.

(10) Patent No.: US 6,963,101 B2
(45) Date of Patent: *Nov. 8, 2005

(54) FILMS DOPED WITH CARBON FOR USE IN INTEGRATED CIRCUIT TECHNOLOGY

(75) Inventors: Ronald A. Weimer, Boise, ID (US); John T. Moore, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/789,981

(22) Filed: Mar. 2, 2004

(65) Prior Publication Data

US 2004/0164336 A1 Aug. 26, 2004

Related U.S. Application Data

(62) Division of application No. 10/229,351, filed on Aug. 28, 2002, now Pat. No. 6,713,807, which is a continuation of application No. 09/229,320, filed on Jan. 13, 1999, now Pat. No. 6,462,371.
(60) Provisional application No. 60/109,925, filed on Nov. 24, 1998.

(51) Int. Cl.[7] .................. H01L 27/108; H01L 29/76; H01L 29/94; H01L 31/119
(52) U.S. Cl. .................. 257/306; 257/296; 257/309
(58) Field of Search .................. 257/295–310, 257/532

(56) References Cited

U.S. PATENT DOCUMENTS

| | | |
|---|---|---|
| 5,245,193 A | 9/1993 | Nakanishi |
| 5,286,344 A | 2/1994 | Blalock et al. |
| 5,302,366 A | 4/1994 | Schuette et al. |
| 5,438,025 A | 8/1995 | Leung et al. |
| 5,441,901 A | 8/1995 | Candelaria |
| 5,471,418 A | 11/1995 | Tanigawa |
| 5,472,488 A | 12/1995 | Allman |
| 5,563,102 A | 10/1996 | Michael |
| 5,716,891 A | 2/1998 | Kodama |
| 5,886,368 A | 3/1999 | Forbes et al. |
| 5,933,760 A | 8/1999 | Iyer et al. |
| 5,976,991 A | 11/1999 | Laxman et al. |
| 6,071,807 A | 6/2000 | Watanabe |
| 6,350,704 B1 | 2/2002 | Ahn et al. |

OTHER PUBLICATIONS

Research Disclosure 408124 (Apr. 1998).

*Primary Examiner*—Cuong Nguyen
(74) *Attorney, Agent, or Firm*—TraskBritt

(57) ABSTRACT

The invention pertains to films comprising silicon, oxygen and carbon and the use of the films in integrated circuit technology, such as capacitor constructions, DRAM constructions, semiconductive material assemblies, etching processes, and methods for forming capacitors, DRAMs and semiconductive material assemblies.

11 Claims, 9 Drawing Sheets

FILMS DOPED WITH CARBON FOR USE IN INTEGRATED CIRCUIT TECHNOLOGY

RELATED APPLICATIONS

This application is a Divisional of U.S. patent application Ser. No. 10/229,351, filed Aug. 28, 2002, issued as U.S. Pat. No. 6,713,807 on Mar. 30, 2004, which is a Continuation of U.S. patent application Ser. No. 09/229,320 filed Jan. 13, 1999, issued as U.S. Pat. No. 6,462,371 on Oct. 8, 2002, which claims priority to U.S. Provisional Application No. 60/109,925, filed Nov. 24, 1998. This application is also related to U.S. Pat. No. 6,162,737, issued on Dec. 19, 2000.

FIELD OF THE INVENTION

The present invention pertains to films comprising silicon and oxygen that are doped with carbon and the use of the films in integrated circuit technology, such as capacitor constructions, DRAM constructions, semiconductive material assemblies, etching processes, and methods for forming capacitors, DRAMS and semiconductive material assemblies.

BACKGROUND OF THE INVENTION

Modern semiconductor device fabrication processes frequently use selective etching conditions that will etch one material more rapidly than another. The material that is etched more rapidly can be referred to as a sacrificial material, and the material that is etched less rapidly can be referred to as a protective or etch stop material. Selective etching can be use in processes in which it is desired to protect a portion of a semiconductor wafer from etching conditions while etching through another portion of the wafer. Exemplary selective etching conditions are dry etch conditions that are selective for etching silicon oxide relative to silicon nitride, including those described in U.S. Pat. No. 5,286,344, the disclosure of which is incorporated by reference herein in its entirety.

Many prior art selective etching methods generally have poor selectivities, such that there is a constant risk that the protective material will be etched away entirely during the etching of the sacrificial material. The selectivity for a given selective etching method is highly dependent on numerous factors, such as the composition of the film and the etching conditions. It would be desirable to develop alternative methods of selective etching having better selectivities under comparable conditions.

A possible mechanism by which selectivity can occur is through selective polymer formation on the protective material during etching of the protective material and the sacrificial material. For instance, etching of silicon oxide and silicon nitride under conditions such as those described in U.S. Pat. No. 5,286,344 can create a carbonaceous polymer on the silicon nitride which protects the silicon nitride during etching of the silicon oxide. The carbon contained in the carbonaceous polymer can originate from, for example, etchant materials, such as gas, liquid or plasma materials, including, for example, $CH_2F_2$ and $CHF_3$. When silicon oxide, such as borophosphosilicate glass (also referred to throughout the specification as BPSG), is selectively etched relative to silicon nitride, the carbon will frequently originate at least in part from etching of the BPSG. Thus, less selectivity is obtained when less BPSG is etched relative to an amount of silicon nitride exposed to the etching conditions. Accordingly, thin layers of BPSG can be more difficult to etch than thick layers. Many selective etching methods are not effective for selectively etching BPSG relative to silicon nitride when the BPSG layers have thicknesses of less than or equal to about 1.3 microns.

An exemplary application of selective etching is a dynamic random access memory (DRAM) forming process. Referring to FIG. 1, a DRAM construction is illustrated with respect to semiconductive wafer fragment 10. Semiconductive wafer fragment 10 comprises a substrate 12, which can be, for example, a monocrystalline wafer lightly doped with a p-type background dopant. The term "semiconductive wafer fragment" refers to any construction comprising semiconductive materials, including, for example, bulk semiconductive materials, such as semiconductive wafers (either alone or in assemblies comprising other materials thereon) and semiconductive material layers (either alone or in assemblies comprising other materials). The term "substrate" refers to any supporting structure, including, for example, the semiconductive wafer fragments described above.

Field oxide regions 15 overlay the substrate 12, and node locations 14, 16 are between the field oxide regions 15. The node locations 14, 16 contain diffusion regions conductively doped with a conductivity-enhancing dopant.

Wordlines 20 overlay the substrate 12. The wordlines 20 comprise a gate oxide layer 24 and a conductive layer 26. The gate oxide layer 24 and conductive layer 26 may also be referred to as a conductive gate. The gate oxide layer 24 can comprise, for example, silicon dioxide. The conductive layer 26 can comprise, for example, conductively doped polysilicon capped with a metal silicide, such as, for example, tungsten silicide or titanium silicide. The wordlines 20 have opposing sidewall edges and sidewall spacers 28 (referred to herein as a "spacer" or "spacers") that extend along the sidewall edges. The spacers 28 can comprise, for example, silicon oxide or silicon nitride. An etch stop layer 32 extends over the wordlines 20. The etch stop layer 32 can comprise, for example, silicon nitride. Although not shown, an insulative layer can be placed between the etch stop layer 32 and the conductive layer 26. The insulative layer can comprise, for example, silicon oxide or silicon nitride.

An insulative layer 34 is provided over the substrate 12 and over the wordlines 20. The insulative layer 34 can comprise, for example, BPSG.

Capacitor constructions 36 extend through the insulative layer 34 to contact the node locations 14. The capacitor constructions 36 comprise a storage node or first electrode 40, a dielectric layer 42, and a second electrode 44. The storage node 40 and second electrode 44 can comprise, for example, conductively doped silicon such as a conductively doped polysilicon. The dielectric layer 42 can comprise, for example, silicon dioxide and/or silicon nitride. Although all the layers 40, 42, 44 are shown extending within openings in the insulative layer 34, other capacitor constructions can be used where some or none of the storage node, dielectric and second electrode layers extend within the opening.

A bit line contact 46 also extends through the insulative layer 34 and contacts a node location 16. The bit line contact 46 is in gated electrical connection with the capacitor construction 36 through the wordline 20. The bit line contact 46 can comprise, for example, tungsten, titanium and/or titanium nitride. Although not shown, a diffusion barrier layer, such as, for example, titanium nitride, can be formed between the bit line contact 46 and the diffusion region of the node location 16.

A second insulative layer 48 extends over the capacitor constructions 36 and electrically isolates the second electrode 44 from the bit line contact 46. The second insulative layer 48 can comprise, for example, silicon dioxide, BPSG or silicon nitride, and can be the same as or different from the first insulative layer 34.

A bit line 50 extends over the second insulative layer 48 and is in electrical connection with the bit line contact 46. Accordingly, the bit line contact 46 electrically connects the bit line 50 to the node location 16. The bit line 50 may comprise, for example, aluminum, copper or an alloy of aluminum and copper.

A method of forming the DRAM construction of FIG. 1 is described with reference to FIGS. 2 and 3. FIG. 2 illustrates a semiconductive wafer fragment 10 at a preliminary processing step. The etch stop layer 32 extends over the wordlines 20, and over the node locations 14, 16. The insulative layer 34 extends over the etch stop layer 32, and a patterned photoresist masking layer 60 is provided over the insulative layer 34. The patterned photoresist masking layer 60 defines an opening 62 which is to be extended to the node location 16 for ultimate formation of the bit line contact 46 (shown in FIG. 1) therein.

Referring to FIG. 3, the opening 62 is extended to the etch stop layer 32. The etch used to extend the opening 62 is preferably selective for the material of the insulative layer 34 relative to that of the etch stop layer 32. For instance, if the insulative layer 34 comprises BPSG and the etch stop layer 32 comprises nitride, the etch can be a fluorocarbon, such as those described in U.S. Pat. No. 5,286,344.

After selectively etching to the etch stop layer 32, subsequent anisotropic etching of the etch stop layer 32 can occur to extend the opening 62 to the node location 16. Such extended opening can also be referred to as a self-aligned contact etch, referring to the opening being aligned with the sidewall edges of the wordlines 20. Preferred self-aligned contact etches are described in U.S. Pat. No. 5,286,344.

After the opening 62 is extended to the node location 16, the patterned photoresist masking layer 60 (shown in FIG. 2) can be removed, and subsequent processing used for forming the bit line contact 46 (shown in FIG. 1) within the opening 62. Also, similar etching described above to form the opening 62 for the bit line contact 46 can be used to form openings to the node locations 14 for formation of the capacitor constructions 36 therein. In the exemplified fabrication process, the opening 62 for the bit line contact 46 is formed prior to forming openings for the capacitor constructions 36 (shown in FIG. 1). However, other fabrication processes are known in the art wherein the openings for the capacitor constructions are formed either before, or simultaneously with, formation of the opening for the bit line contact.

FIG. 3 illustrates an idealized selective etch, where the etch stops substantially entirely upon reaching the etch stop layer 32. However, as discussed above, prior art etching processes are generally not much more selective for sacrificial materials (the material of insulative layer 34) than for protective materials (the material of etch stop layer 32). Accordingly, the selective etches do not generally stop substantially entirely upon reaching the etch stop layer 32, but rather continue at a slower rate upon reaching the etch stop layer 32.

FIG. 4 illustrates a prior art problem that can occur as a result of the continued etching of the etch stop layer 32. Specifically, the etch stop layer 32 can become thinned to an extent that the spacers 28 are exposed to the etching conditions. Such exposure can lead to etching through the spacers 28 to expose the conductive layer 26. In a bad scenario, the conductive layer 26 is shorted to the bit line contact 46 (shown in FIG. 1) when the conductive material of the bit line contact 46 is formed within the opening 62. Also, the thinning of the etch stop layer 32 can lead to unpredictability during a subsequent etch of the etch stop layer 32 to expose the node location 16. It is then unknown how long to continue a subsequent etch. If the etch continues for too long, the etch can undesirably penetrate into the substrate 12, and possibly through the diffusion region at the node location 16.

As can be seen from the above discussion, there is a need in the art for improving the selectivity of the etching process in integrated circuit applications. The present invention is directed to these, as well as other, important ends.

SUMMARY OF THE INVENTION

The present invention describes semiconductive assemblies comprising semiconductive substrates, and layers over the semiconductive substrates, wherein the layers comprise silicon, about 5% to about 75% by weight oxygen, about 2% to about 20% by weight carbon and, optionally, nitrogen. The present invention also describes methods for forming semiconductive assemblies.

The present invention also describes wordline assemblies comprising conductive gates having sidewalls and spacers next to the sidewalls of the conductive gates, wherein the spacers comprise silicon, about 2% to about 20% by weight carbon, about 5% to about 75% by weight oxygen and, optionally, nitrogen. The wordline assemblies can further comprise cap layers overlying the conductive gates. The present invention also describes methods for forming wordline assemblies.

In another embodiment, the present invention describes capacitor assemblies comprising a storage node extending within an insulative layer, wherein the storage node is next to a layer comprising silicon, about 2% to about 20% by weight carbon about 5% to about 75% by weight oxygen and, optionally, nitrogen; a second electrode proximate the storage node; and a dielectric layer between the storage node and the second electrode. The present invention also describes methods for forming capacitor assemblies.

In yet another embodiment, the present invention describes DRAMs comprising a substrate, a wordline over the substrate, wherein the wordline has a sidewall; a first node and a second node proximate the wordline, wherein the first node is in gated electrical connection with the second node via the wordline; a spacer next to the sidewall of the wordline, wherein the spacer comprises silicon, about 2% to about 20% by weight carbon, about 5% to about 75% by weight oxygen and, optionally, nitrogen; an insulative layer over the spacer, the wordline, the first node and the second node; a capacitor assembly in electrical connection with the first node; and a bit line contact in electrical connection with the second node. The DRAMs can further comprise a cap layer overlying the wordline. The present invention also describes methods for forming DRAMs.

The present invention also describes assemblies comprising a substrate; a layer comprising silicon, about 2% to about 20% by weight carbon, about 5% to about 75% by weight oxygen and, optionally, nitrogen; and a photoresist masking layer. The present invention also describes methods for forming such assemblies.

In yet another embodiment, the present invention describes methods for reducing the etch rate of a film comprising doping a film with 2% to about 20% by weight carbon to reduce the etch rate of the film, wherein the film comprises silicon, about 5% to about 75% by weight oxygen and, optionally, nitrogen. In another embodiment, the present invention describes etching methods comprising doping a first film with about 2% to about 20% by weight carbon, wherein the first film comprises silicon, about 5% to about 75% by weight oxygen and, optionally, nitrogen; and selectively etching a second film comprising silicon relative to the first film.

These and other embodiments of the present invention are described in more detail below.

DETAILED DESCRIPTION OF THE INVENTION

Figure 1:
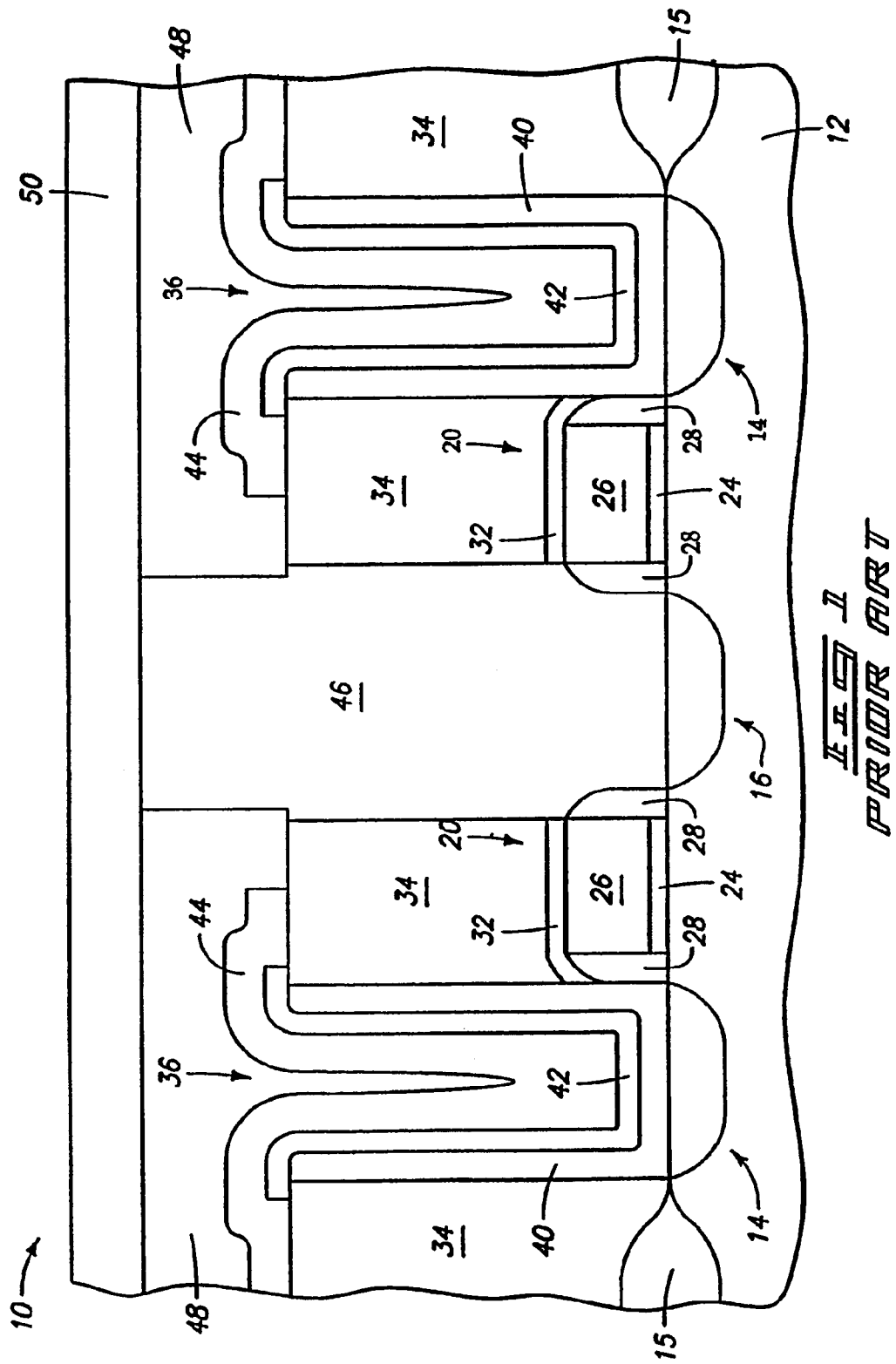
FIG. 1 is a diagrammatic, cross-sectional view of a prior art semiconductive wafer fragment comprising a DRAM assembly.

As used throughout the disclosure, the following terms have the following meanings: BPSG refers to borophosphosilicate glass; DRAM refers to dynamic random access memory; BTBAS refers to bis(tertiary butyl amino)silane; TEOS refers to tetraethylorthosilicate; and SiC refers to silicon carbide.

The present invention describes methods to decrease the etch rate of films comprising silicon and oxygen by doping the films with carbon. For example, the present invention describes methods to decrease the etch rate of films comprising silicon and oxygen as they are subjected to an anisotropic dry etch process by adding carbon to the film. The selectivity of the etch of a first material relative to a second material can be increased by adding carbon to the second material.

As described in co-pending application Ser. No. 09/175,051, filed Oct. 9, 1998, now U.S. Pat. No. 6,251,802, which issued Jun. 26, 2001 (the disclosure of which is incorporated by reference herein in its entirety), the incorporation of carbon into a film can greatly reduce the etch rate of the film using an otherwise identical selective etch process. Without intending to be bound by any theory of the invention, it is believed that carbon increases the etch process selectivity by increasing the activation energy required by the etching process. An advantage of the relatively high activation energy films of the present invention, relative to the lower activation energy films of the prior art, is that lower activation energy films generally require more selective processes than do higher activation energy films. As processing conditions become more highly selective, the processing conditions tend to become less stable. Accordingly, since the carbon can allow for less selective processing conditions to be used to accomplish similar results as obtained in the prior art using more highly selective processing conditions, the present invention can allow for more robust processing conditions to be used than can be used by the prior art. Also, the present invention can increase a "process window," to further increase stability of the processing conditions. In other words, the carbon incorporation of the present invention can enable a selective process to occur across a broader range of conditions than such process would occur using prior art methods.

Another advantage of the increased etch selectivity that can be accomplished by the methods of the present invention is that the etch stop layers can be thinner. Prior art etch stop layers typically have a thickness of at least 2,000 angstroms. One reason for this thickness is to compensate for over-etching of the etch stop layer that can occur in a selective etch. The enhanced selectivity that can be accomplished by the methods of the present invention can allow for the etch stop layer to be less than or equal to about 500 angstroms, without increasing the risk of over-etching. Reducing the thickness of the etch stop layer provides additional space for capacitor constructions in a DRAM assembly, which allows for more charge to be stored over a given area of semiconductive wafer than was achievable by the prior art methods.

Yet another unexpected advantage of the present invention is that doping a film comprising silicon and oxygen with carbon results in a film having a lower dielectric constant. The dielectric constant of the film of the present invention can be from about 4 to about 7, preferably greater than or equal to about 5 to less than or equal to about 6. The lower dielectric constant achieved by the present invention provides improved capacitive characteristics for semiconductive materials, capacitors and DRAMs.

Figure 5:
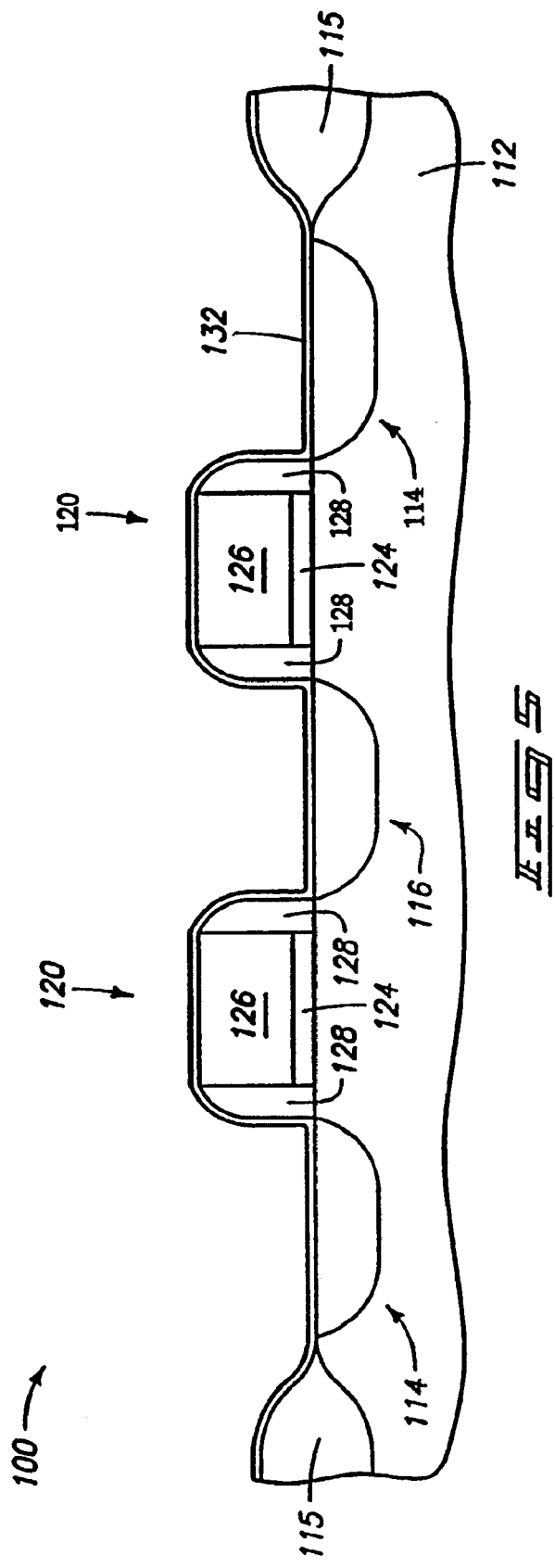
FIG. 5 is a diagrammatic, cross-sectional view of a semiconductive wafer fragment processed according to the methods of the present invention.

The methods of the present invention are described with reference to FIGS. 5–9. Referring to FIG. 5, a semiconductive wafer fragment 100 comprises a substrate 112 having wordlines 120 formed thereover. Spacers 128 extend along the sidewalls of the wordlines 120. The substrate 112, wordlines 120 and spacers 128 can comprise constructions identical to those discussed above for the prior art. Node locations 114, 116 are provided between the wordlines 120 and can comprise constructions identical to those discussed above for the prior art. Although not shown, a cap layer can overlay the conductive layer 126 of the wordline 120. Such a cap layer can comprise, for example, silicon oxide or silicon nitride, and can have the same or different composition as the spacers 128.

An etch stop layer 132 is formed over the substrate 112 and over the wordlines 120. The etch stop layer 132 of the present invention is a film formed by combining a silicon-comprising material with a carbon-comprising material and at least one oxidizing agent. Portions of the etch stop layer 132 extend along the spacers 128. The etch stop layer 132 can be formed to a thickness of less than about 1500 angstroms, preferably less than or equal to about 500 angstroms.

The etch stop layer 132 can be formed by, for example, chemical vapor deposition (CVD) of a silicon-comprising material in the presence of a carbon-comprising material and at least one oxidizing agent. Preferably the silicon-comprising material is silicon nitride and/or silicon oxide. The silicon oxide can be, for example, silicon oxide or BPSG. Alternatively, the silicon-comprising material can be BTBAS. Preferably, the carbon-comprising material is TEOS and/or BTBAS, more preferably BTBAS. The carbon is preferably incorporated into the film in the form of silicon carbide (SiC). The oxidizing agent is preferably an oxide and/or an oxynitride, such as, for example, $N_2O$, $O_2$ and/or $O_3$.

The etch stop layer 132 can be deposited, for example, in a chemical vapor deposition (CVD) reactor having a pressure of about 50 mTorr to about 10 Torr, a temperature of about 400° C. to about 750° C., an $SiH_4$ flow rate of about 0 to about 500 sccm, an $N_2O$ flow rate of about 0 to about 1000 sccm, an $O_2$ flow rate of about 0 to about 1000 sccm, and a BTBAS flow rate of about 0 to about 500 sccm, to form an etch stop layer 132 having a composition as described below.

In another embodiment, carbon can be incorporated into the etch stop layer 132 by doping the etch stop layer 132 with carbon after deposition of the etch stop layer 132. Doping can be conducted by methods known in the art, including, for example, ion implanting with a carbon-comprising material or vapor annealing with a carbon-comprising material.

In the present invention, the film comprises silicon, carbon and oxygen, and, optionally, nitrogen. The film can be an etch stop layer, a spacer, a cap layer and the like. In one embodiment, the film can comprise about 20% to about 65% by weight silicon, about 2% to about 20% by weight carbon, about 5% to about 75% by weight oxygen and about 0% to about 30% by weight nitrogen.

In another embodiment, the film can comprise about 20% to about 65% by weight silicon, about 5% to about 20% by weight carbon, preferably about 10% to about 20% by weight carbon, about 5% to about 25% by weight oxygen, preferably about 10% to about 20% by weight oxygen, and about 0% to about 30% by weight nitrogen, preferably about 10% to about 30% by weight nitrogen.

In yet another embodiment, the film can comprise about 20% to about 65% by weight silicon, about 2% to about 20% by weight carbon, preferably about 2% to about 10% by weight carbon, about 40% to about 75% by weight oxygen, preferably about 45% to about 65% by weight oxygen, more preferably about 50% to about 60% by weight oxygen, and from about 0% to about 15% by weight-nitrogen, more preferably about 1% to about 10% by weight nitrogen.

Figure 2:
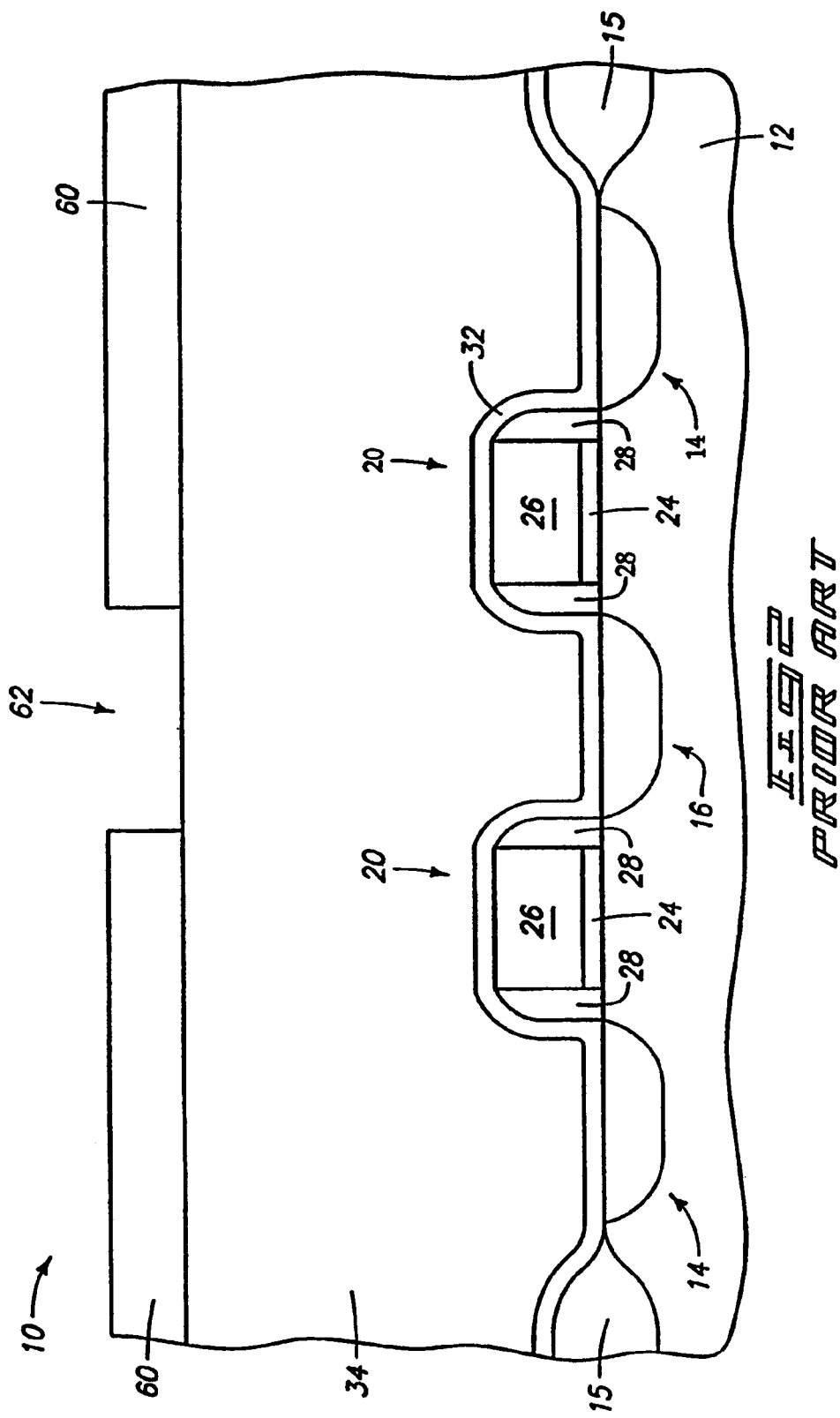
FIG. 2 is a diagrammatic, cross-sectional view of a semiconductive wafer fragment at a preliminary processing step in forming the DRAM assembly of FIG. 1.
Figure 3:
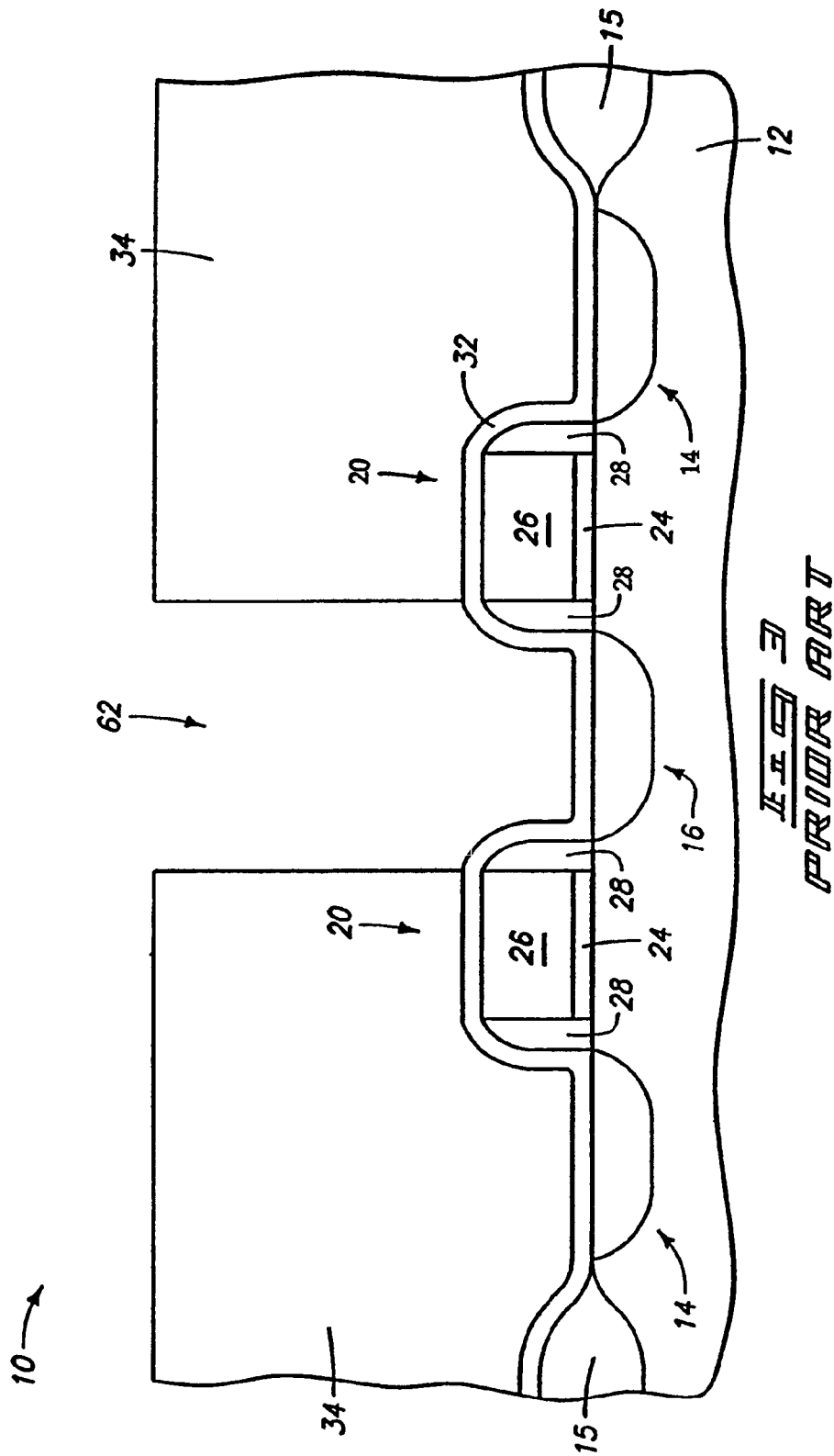
FIG. 3 is an idealized view of a semiconductive wafer fragment at a processing step subsequent to that shown in FIG. 2 and prior to that shown in FIG. 1.
Figure 6:
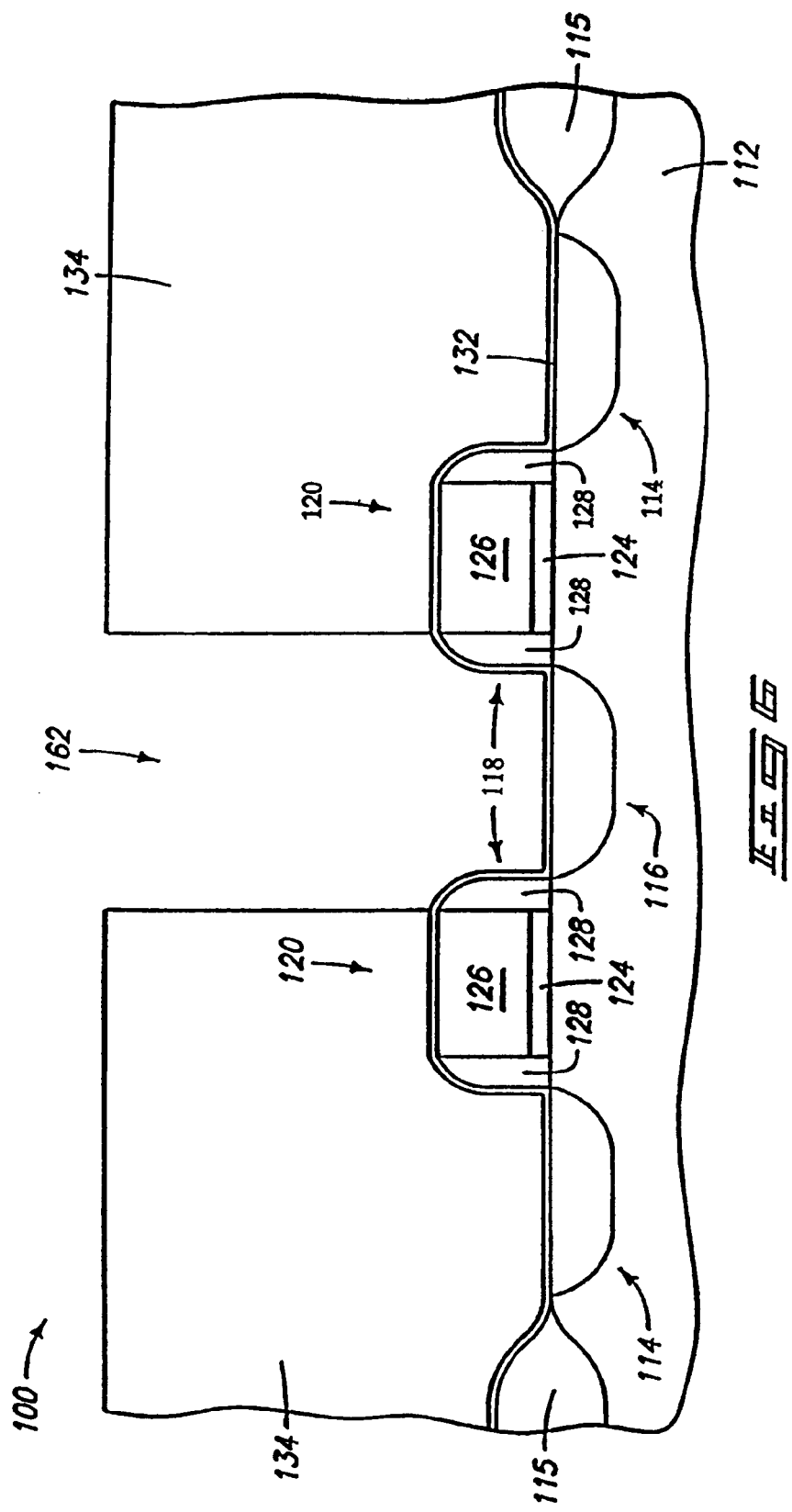
FIG. 6 is a diagrammatic, cross-sectional view of a semiconductive wafer fragment at a processing step subsequent to that of FIG. 6.

Referring to FIG. 6, an insulative layer 134 is formed over the etch stop layer 132 and an opening 162 is etched into the insulative layer 134 to stop at the etch stop layer 132. The insulative layer 134 can comprise, for example, BPSG. The opening 162 is defined by, for example, a patterned photoresist masking layer, as described in reference to FIG. 2 above. The sides of the opening 162 are aligned with portions 118 of the etch stop layer 132 that extend along the spacers 128. The insulative layer 134 and opening 162 can be formed by methods discussed in the background section of the specification. The carbon incorporated in the etch stop layer 132 can greatly increase the selectivity of the etch of the insulative layer 134 relative to the etch stop layer 132. Such selectivity can decrease the risk of the prior art over-etch problems illustrated in FIG. 4. The decreased risk of over-etch problems accomplished by carbon incorporation in the etch stop layer 132 allows the etch stop layer 132 to be formed thinner than the etch stop layer 32 used in the prior art. Accordingly, there can be more space above the etch stop layer 132 for circuit constructions. Also, the incorporation of carbon in the etch stop layer 132 allows for etch selectivity to be obtained even if the insulative layer 134 is very thin before the etch. For example, the insulative layer 134 can be less than 1.3 microns thick before the etch and etch selectivity can still be obtained. Additionally, the incorporation of carbon in an etch stop layer that comprises silicon and oxygen provides an etch stop layer with a lower dielectric constant.

After the selective etch to expose the etch stop layer 132, further processing can be used to extend the opening 162 to the node location 116. Such further processing can include a silicon nitride etch, such as, for example, hot phosphoric acid.

Figure 7:
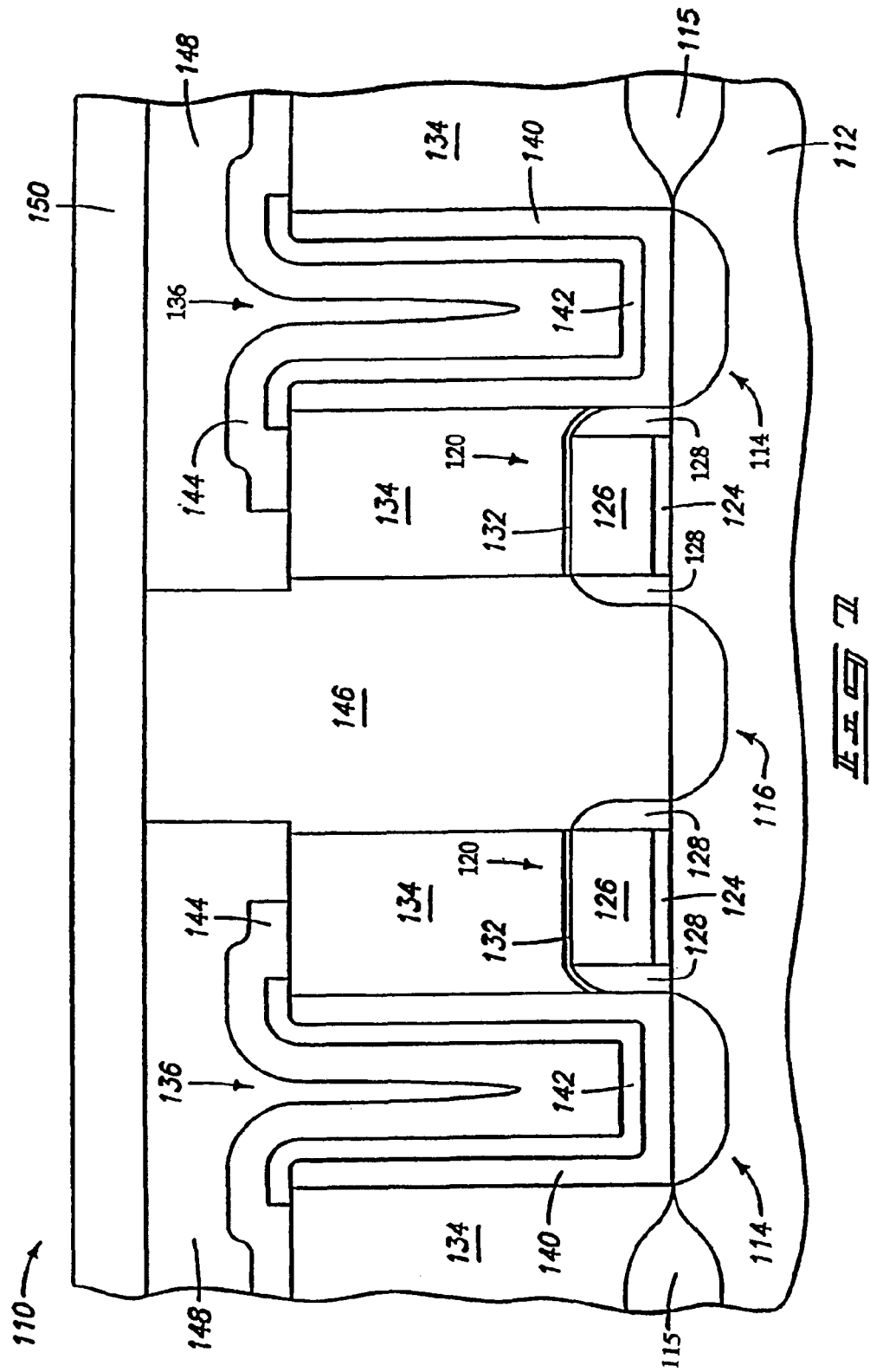
FIG. 7 is a diagrammatic, cross-sectional view of a semiconductive wafer fragment at a processing step subsequent to that of FIG. 6.

Subsequently, a bit line contact similar to the bit line contact 46 of the prior art can be formed within the opening 162. Also, further processing can be conducted to form capacitor constructions similar to the prior art to complete a DRAM assembly from the construction of FIG. 6. Such DRAM assembly is shown in FIG. 7, with components analogous to those of FIG. 1 labeled with integers 100 units larger than the integers used in FIG. 1. The DRAM assembly of FIG. 7 comprises capacitor constructions 136, which comprise storage node layers 140, dielectric layers 142 and second electrodes 144. Capacitor constructions 136 can be larger than capacitor constructions 36 of FIG. 1 even though the DRAM assembly of FIG. 7 occupies the same amount of wafer space as the DRAM assembly of FIG. 1 due to the increased area available by the etch stop layer 132 being thinner than the prior art etch stop layer 32.

Figure 8:
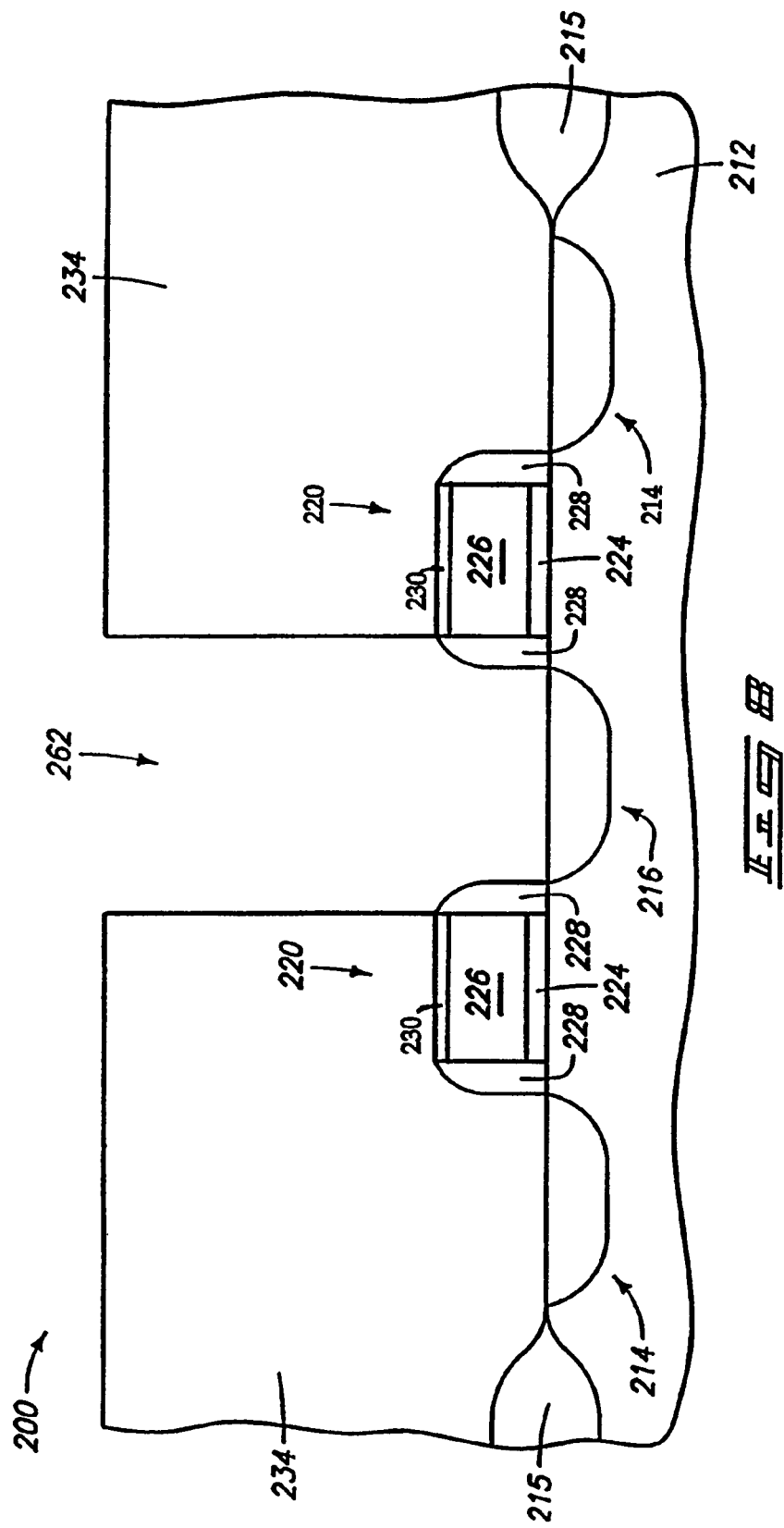
FIG. 8 is a diagrammatic, cross-sectional view of a semiconductive wafer fragment processed according to the methods of the present invention.

Another embodiment of the present invention is described with reference to FIGS. 8 and 9. Such embodiments comprise forming spacers doped with carbon to decrease the etch rate of the spacers relative to the overlying insulative layer. Referring to FIG. 8, a semiconductive wafer fragment: 200 comprises a substrate 212 and overlying wordlines 220. Node locations 214, 216 are between the wordlines 220. The substrate 212, wordlines 220 and node locations 214, 216 can comprise constructions similar to those discussed with respect to the prior art.

The spacers 228 extend along the sidewalls of the wordlines 220. The cap layer 230 overlays the conductive layer 226 of the wordlines 220. The spacers 228 and cap layer 230 are a film formed by combining a silicon-comprising material with a carbon-comprising material and at least one oxidizing agent. Preferably the silicon comprising material is silicon nitride and/or silicon oxide. The silicon oxide can be, for example, silicon oxide or BPSG. Alternatively, the silicon-comprising material can be BTBAS. Preferably the carbon-comprising material is TEOS and/or BTBAS, more preferably BTBAS. The carbon is preferably incorporated into the film in the form of silicon carbide (SiC). The oxidizing agent is preferably an oxide and/or an oxynitride, such as, for example, $N_2O$, $O_2$ and/or $O_3$.

The spacers 228 and cap layer 230 can be formed, for example, by chemical vapor deposition (CVD) using the reaction conditions described above for the etch stop layer 132 of the present invention.

In another embodiment, carbon can be incorporated into the spacers 228 and/or cap layer 230 by doping the spacers 228 and/or cap layer 230 with carbon after deposition of the spacers 228 and/or cap layer 230. Doping can be conducted by methods known in the art, including, for example, ion implanting with a carbon comprising material or vapor annealing with a carbon-comprising material.

In the present invention, the spacer and/or cap layer comprises silicon, carbon and oxygen, and, optionally, nitrogen. In one embodiment, the spacer and/or cap layer can comprise about 20% to about 65% by weight silicon, about 2% to about 20% by weight carbon, about 5% to about 75% by weight: oxygen and about 0% to about 30% by weight nitrogen.

In another embodiment, the spacer and/or cap layer can comprise about 20% to about 65% by weight silicon, about 5% to about 20% by weight carbon, preferably about 10% to about 20% by weight carbon, about 5%, to about 25% by weight oxygen, preferably about 10% to about 20% by weight oxygen, and about 0% to about 30% by weight nitrogen, preferably about 10% to about 30% by weight nitrogen.

In yet another embodiment, the spacer and/or cap layer can comprise about 20% to about 65% by weight silicon, about 2% to about 20% by weight carbon, preferably about 2% to about 10% by weight carbon, about 40% to about 75% by weight oxygen, preferably about 45% to about 65% by weight oxygen, more preferably about 50% to about 60% by weight oxygen, and from about 0% to about 15% by weight nitrogen, more preferably about 1% to about 10% by weight nitrogen.

An insulative layer 234 is formed over the wordlines 220 and over the spacers 228 and cap layer 230. The insulative layer 234 can comprise, for example, BPSG. A difference between the construction of FIG. 8 and the prior art constructions is that the construction of FIG. 8 does not have an etch stop layer provided over the wordlines 220. However, in an alternative embodiment, an etch stop layer can be provided over the spacer and/or cap layer.

An opening 262 is etched through insulative layer 234 and to the substrate 212. The opening is defined by, for example, a patterned photoresist masking layer, as described above in reference to FIG. 2. The opening 262 is aligned relative to the spacer 228 proximate the substrate 212. In one embodiment, the insulative layer 234 comprises BPSG and the spacers 228 and cap layer 230 comprise silicon nitride. In this aspect of the invention, a first silicon oxide layer (BPSG insulative layer 234) is etched selectively relative to a second silicon nitride layer (the layer of one or more of the spacers 228 and/or cap layer 230) by virtue of the carbon that has been incorporated/doped into the second layer that comprises silicon and oxygen.

Figure 9:
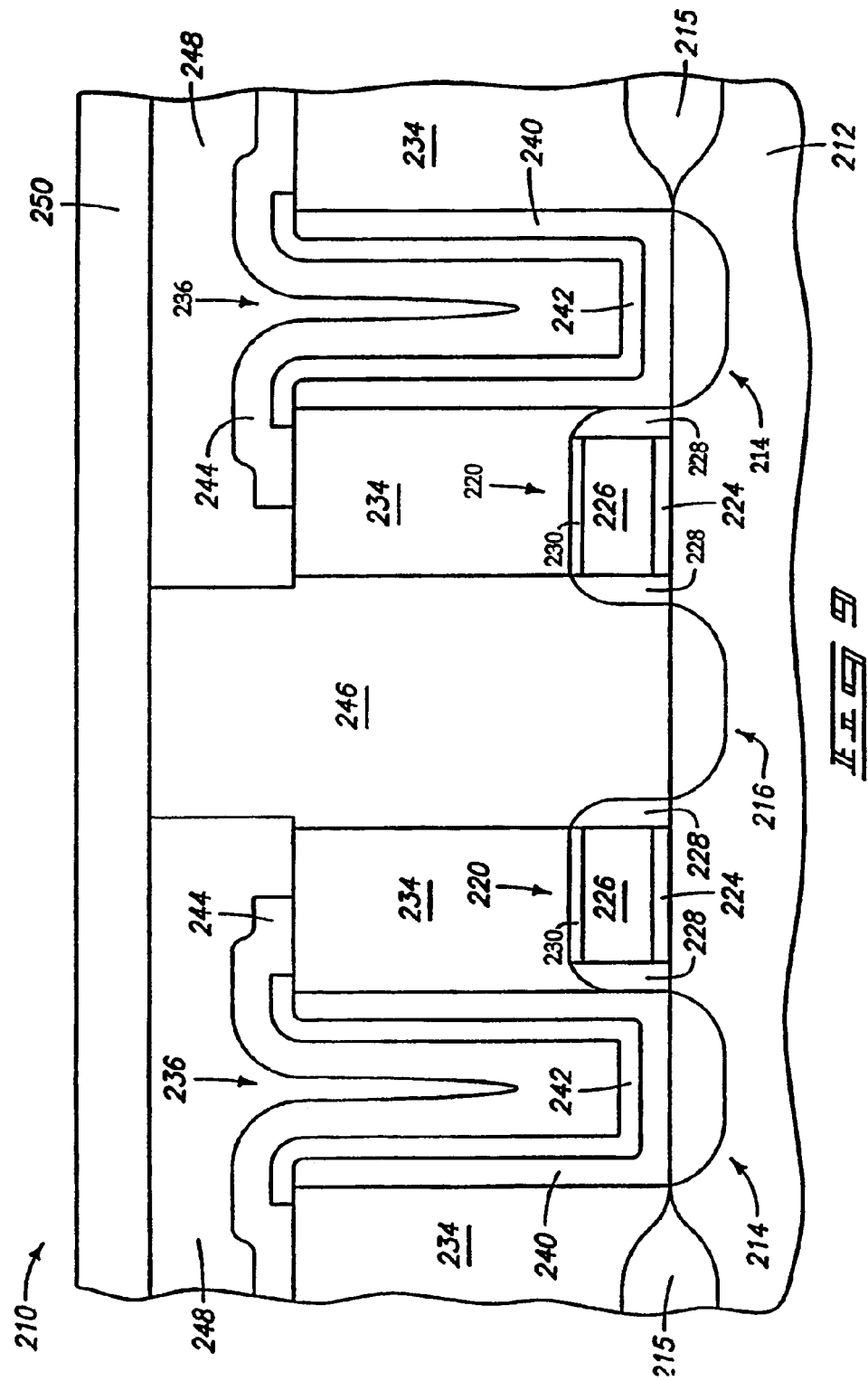
FIG. 9 is a diagrammatic, cross-sectional view of a semiconductive wafer fragment at a processing step subsequent to that of FIG. 8.

Referring to FIG. 9, semiconductive wafer fragment 210 can be processed according to methods similar to those described above with reference to FIG. 1 to produce a DRAM assembly. The DRAM assembly of FIG. 9 is labeled similarly to that of FIG. 1 with components analogous to those of FIG. 1 labeled with integers 200 units larger than the integers used in FIG. 1.

The DRAM assembly of FIG. 9 comprises capacitors, which can be larger than the capacitors of FIG. 1, even though the DRAM assembly of FIG. 9 occupies the same amount of space as the DRAM assembly of FIG. 1, due to the elimination of the etch stop layer.

Even if an etch stop layer is present, the spacers 228 can be thinner than the prior art spacers 28 to provide additional room for capacitor constructions. Specifically, a function of the prior art spacers 28 can be to provide a barrier in the event that etch stop layer 32 is etched through during processing to form opening 62. As the spacers 228 of the present invention are more resistant to etching than the prior art spacers 28, the spacers 228 can be formed thinner than prior art spacers 28 and still form an effective barrier against etch-through. For instance, prior art spacers 28 would typically be formed to a thickness of at least about 900 angstroms (the "thickness" being defined as an amount by which the spacers extend outwardly or horizontally from the sidewalls of the wordlines). The spacers 228 and/or cap layer 230 of the present invention can be formed to a thickness of less than or equal to about 500 angstroms, preferably less than or equal to about 100 angstroms. The thinner spacers 228 can provide additional room for capacitor construction relative to the room available for capacitor construction in the prior art. Additionally, the incorporation of carbon in the films that comprise silicon and oxygen provides spacers and cap layers with a lower dielectric constant.

One skilled in the art will appreciate that the embodiments of the present invention shown in FIG. 5 and FIG. 8 can both be used in the same semiconductive assembly. Alternatively, the etch stop layer, spacers and/or cap layer can all be used independently in a semiconductive assembly.

The films of the present invention can also be used as an anti-reflective coating in integrated circuit technology. As the silicon content of a film is increased, the absorption of the film becomes more pronounced. Using the film of the present invention prior to a photoresist masking layer would reduce the compound reflectivity of the underlying layers. Excess silicon is easily incorporated into these films by simple precursor flow rate changes. Photoresist masking layers must generally be optimized by thickness.

EXAMPLES

The following examples are presented for purposes of elucidation and not limitation. The examples are not intended, nor are they to be construed, as limiting the scope of the disclosure or claims.

Example 1

An etch-resistant film was prepared in a chemical vapor deposition reactor under the following conditions: a pressure of about 500 mTorr, a temperature of about 575° C., an $N_2O$ flow rate of about 50 sccm, an $O_2$ flow rate of about 50 sccm, and a BTBAS flow rate of about 125 sccm. The resulting film had a stoichiometric composition of $SiO_{1.4}N_{0.2}C_{0.1}$, and a thickness of about 1040 angstroms.

Example 2

An etch-resistant film was prepared in a chemical vapor deposition (CVD) reactor under the following conditions: a pressure of about 500 mTorr, a temperature of about 575° C., an $N_2O$ flow rate of about 150 sccm, and a BTBAS flow rate of about 125 sccm. The resulting film had a stoichiometric composition of $SiO_{1.3}N_{0.5}C_{0.3}$ and a thickness of about 630 angstroms.

Although the invention has been set forth in detail and with reference to examples, one skilled in the art will appreciate that changes and modifications can be made to the invention without departing from the spirit and scope of the invention.

What is claimed is:

1. A capacitor assembly comprising:
   a storage node extending within an insulative layer, wherein the storage node is next to a layer comprising silicon, about 2% to about 20% by weight carbon and about 5% to about 75% by weight oxygen;

a second electrode proximate the storage node; and a dielectric layer between the storage node and the second electrode.

2. The capacitor assembly of claim 1, wherein the storage node is next to a layer comprising about 20% to out 65% by weight silicon, about 0% to about 30% by weight nitrogen, about 10% to about 20% a by weight carbon, and about 5% to about 25% by weight oxygen.

3. The capacitor assembly of claim 1, wherein the storage node is next to a layer comprising about 20% to out 65% by weight silicon, about 0% to about 15% by weight nitrogen, about 2% to about 10% by weight carbon, and about 40% to about 75% by weight oxygen.

4. The capacitor of claim 1, wherein the storage node comprises conductively doped silicon.

5. The capacitor of claim 1, wherein the insulative layer comprises silicon oxide or silicon nitride.

6. The capacitor of claim 1, wherein the dielectric layer comprises silicon dioxide or silicon nitride.

7. An assembly comprising:

a substrate;

a layer comprising silicon, about 2% to about 20% by weight carbon and about 5% to about 75% by weight oxygen; and a photoresist masking layer.

8. The assembly of claim 7, wherein the layer comprises about 20% to about 65% by weight silicon, about 10% to about 20% by weight carbon, about 5% to about 25% by weight oxygen and about 0% o about 30% by weight nitrogen.

9. The assembly of claim 7, wherein the layer comprises about 20% to about 65% by weight silicon, about 2% to about 10% by weight carbon, about 40% to about 75% by weight oxygen and about 0% a about 15% by weight nitrogen.

10. The assembly of claim 7, wherein the photoresist masking layer is a patterned photoresist masking layer.

11. The assembly of claim 7, wherein the substrate is a monocrystalline wafer.

* * * * *

UNITED STATES PATENT AND TRADEMARK OFFICE
CERTIFICATE OF CORRECTION

Figure 4:
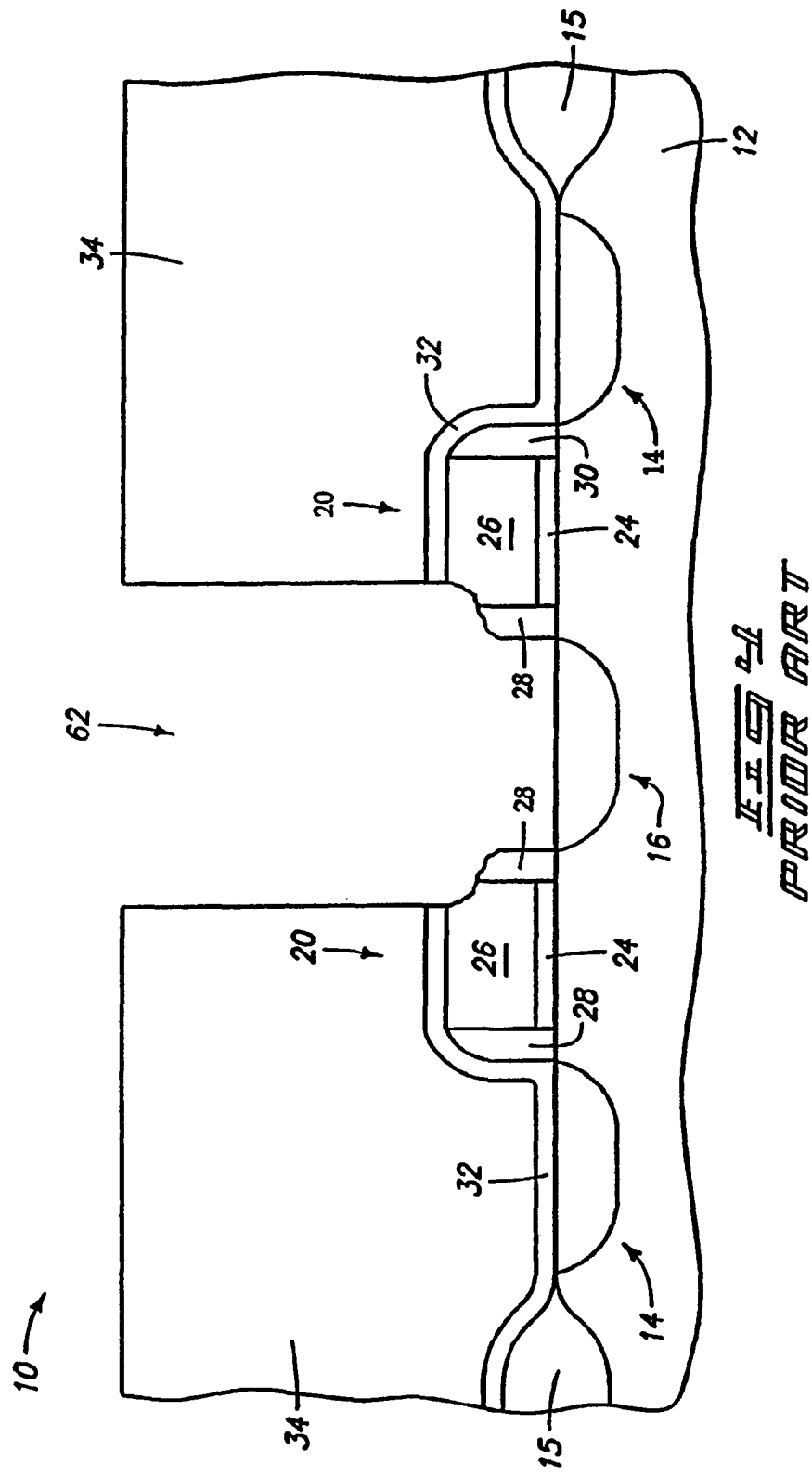
FIG. 4 is a view of a semiconductive wafer fragment at a processing step subsequent to that shown in FIG. 2 and prior to that shown in FIG. 1 where the results of the etch are not ideal.

PATENT NO. : 6,963,101 B2  
APPLICATION NO. : 10/789981  
DATED : November 8, 2005  
INVENTOR(S) : Ronald A. Weimer and John T. Moore It is certified that error appears in the above-identified patent and that said Letters Patent is hereby corrected as shown below:

Replace FIG. 4 with the following amended figure:
--

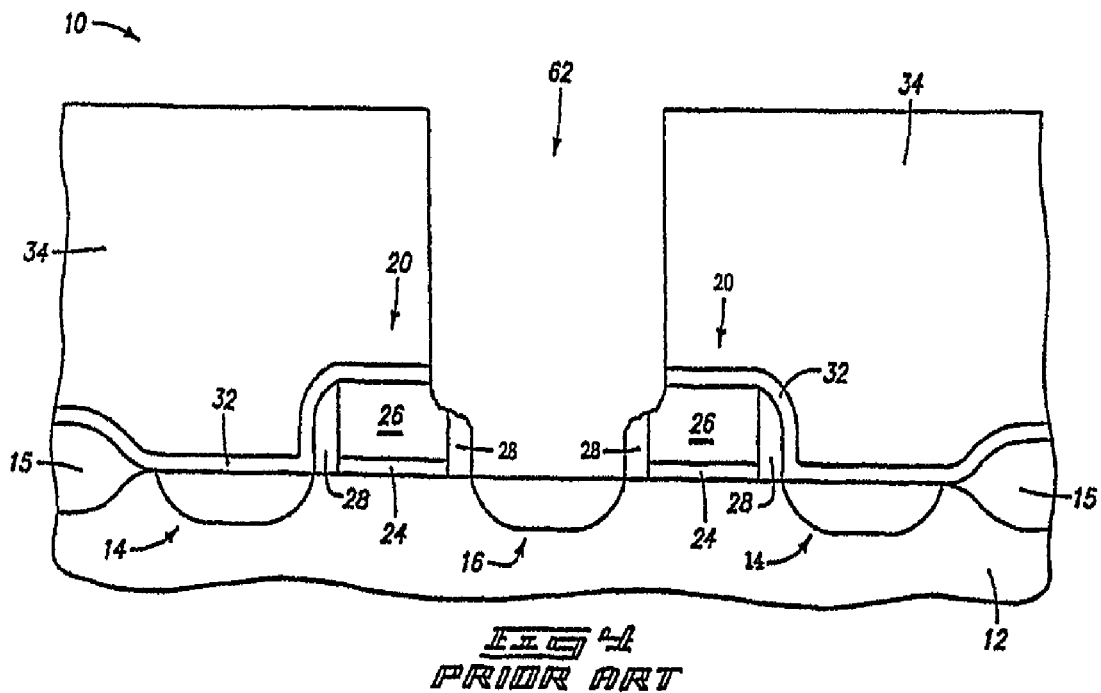

--

| | | |
|---|---|---|
| COLUMN 8, LINE 26, | | change "integers 100 units" to --integers 100 units-- |
| COLUMN 9, LINE 55, | | change "integers 200 units" to --integers 200 units-- |
| COLUMN 10, LINE 42, | | change "deposition reactor" to --deposition (CVD) reactor-- |

In the claims:

| | | |
|---|---|---|
| CLAIM 2, | COLUMN 11, LINE 5, | change "to out" to --to about-- |
| CLAIM 2, | COLUMN 11, LINE 7, | change "20% a by" to --20% by-- |
| CLAIM 3, | COLUMN 11, LINE 10, | change "to out" to --to about-- |
| CLAIM 8, | COLUMN 12, LINE 9, | change "0% o about" to --0% to about-- |

UNITED STATES PATENT AND TRADEMARK OFFICE
CERTIFICATE OF CORRECTION

PATENT NO. : 6,963,101 B2
APPLICATION NO. : 10/789981
DATED : November 8, 2005
INVENTOR(S) : Ronald A. Weimer and John T. Moore It is certified that error appears in the above-identified patent and that said Letters Patent is hereby corrected as shown below:

In the claims (cont'd):
CLAIM 9,   COLUMN 12, LINE 14,   change "0% a about" to --0% to about--

Signed and Sealed this

Fourth Day of September, 2007

JON W. DUDAS
*Director of the United States Patent and Trademark Office*